United States Patent [19]

Beilstein, Jr. et al.

[11] Patent Number: 5,670,428
[45] Date of Patent: Sep. 23, 1997

[54] SEMICONDUCTOR CHIP KERF CLEAR METHOD AND RESULTANT SEMICONDUCTOR CHIP AND ELECTRONIC MODULE FORMED FROM THE SAME

[75] Inventors: Kenneth Edward Beilstein, Jr., Essex Junction; Claude Louis Bertin, So. Burlington; Timothy Harrison Daubenspeck, Colchester; Wayne John Howell, Williston, all of Vt.

[73] Assignee: International Business Machines Corporation, Armonk, N.Y.

[21] Appl. No.: 422,029

[22] Filed: Apr. 13, 1995

Related U.S. Application Data

[62] Division of Ser. No. 301,290, Sep. 6, 1994, Pat. No. 5,596,226.

[51] Int. Cl.$^6$ .................................................. H01L 21/60
[52] U.S. Cl. ........................ 437/205; 437/225; 437/226
[58] Field of Search ................................ 437/205, 225, 437/226; 257/758, 700, 735

[56] References Cited

U.S. PATENT DOCUMENTS

| | | | |
|---|---|---|---|
| 5,103,287 | 4/1992 | Mase et al. | 357/71 |
| 5,104,820 | 4/1992 | Go et al. | 437/51 |
| 5,249,728 | 10/1993 | Lam | 228/111 |
| 5,391,921 | 2/1995 | Kudoh et al. | 257/758 |
| 5,397,916 | 3/1995 | Normington | 257/686 |
| 5,532,174 | 7/1996 | Corrigan | 437/8 |

*Primary Examiner*—John Niebling
*Assistant Examiner*—Michael S. Lebentritt
*Attorney, Agent, or Firm*—Heslin & Rothenberg, P.C.

[57] ABSTRACT

A fabrication method including a semiconductor chip kerf clear process and a resulting semiconductor chip and electronic module formed thereby. The fabrication method includes providing a wafer comprising a plurality of integrated circuit chips having kerf regions between them. Chip metallization is present within the kerf regions. A photolithography process is used to protect the wafer exposing only the kerf regions. Next, the wafer is etched, clearing the chip metallization from the kerf regions. The wafer is then diced and the chips are stacked to form a monolithic electronic module. A side surface of the electronic module is processed to expose transfer metals extending thereto, thereby facilitating electrical connection to the chips within the electronic module. Specific details of the fabrication method, resulting integrated circuit chips and monolithic electronic module are set forth.

15 Claims, 7 Drawing Sheets

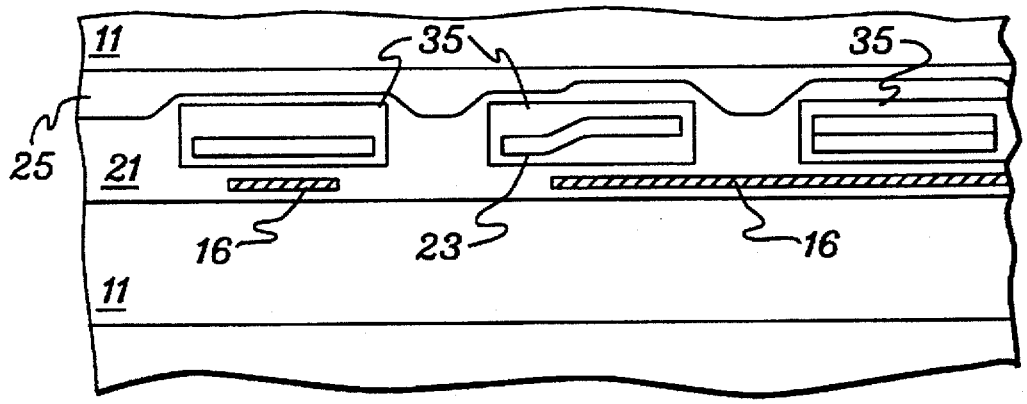
fig. 11A
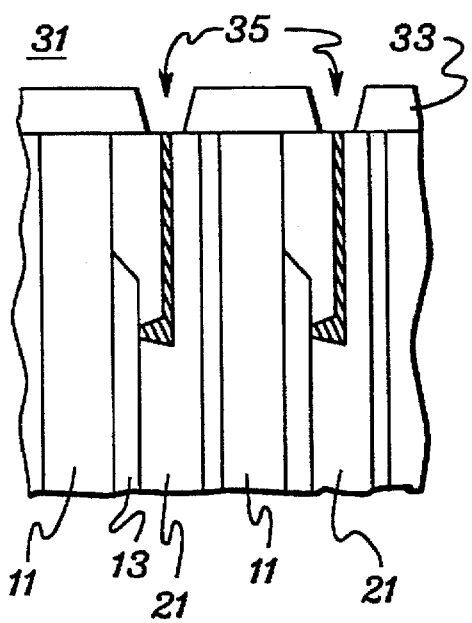 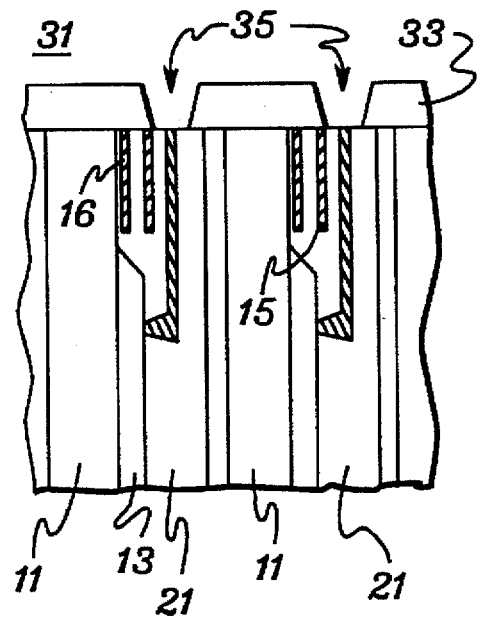
fig. 12                fig. 13
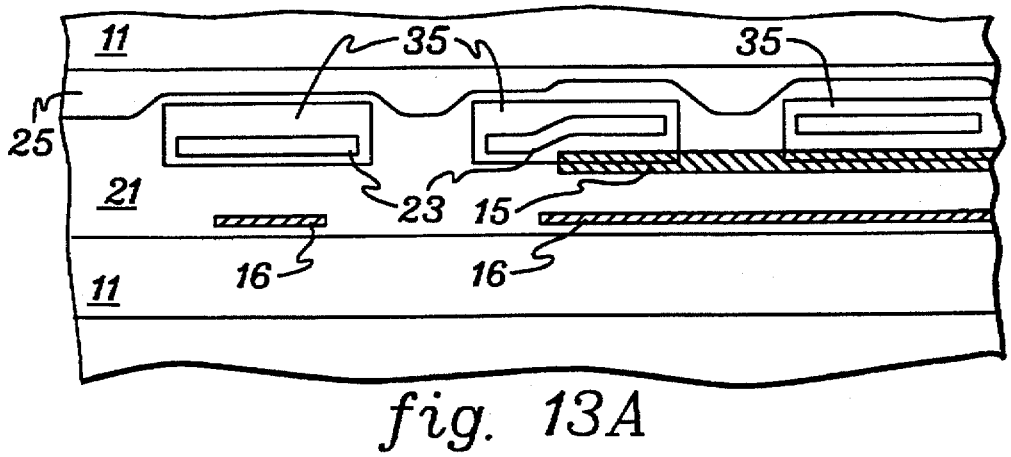
fig. 13A

SEMICONDUCTOR CHIP KERF CLEAR METHOD AND RESULTANT SEMICONDUCTOR CHIP AND ELECTRONIC MODULE FORMED FROM THE SAME

This application is a division of application Ser. No. 08/301,290, filed Sep. 6, 1994, now U.S. Pat. No. 5,596,226.

TECHNICAL FIELD

The present invention relates in general to high density electronic packaging which permits optimization of the number of circuit elements to be included in a given volume. More particularly, this invention relates to a technique for selectively removing material from the kerf region associated with a semiconductor chip used in forming an electronic module comprising a "stack" of chips.

BACKGROUND OF THE INVENTION

Since the development of integrated circuit technology, computers and computer storage devices have been made from integrated circuit (IC) chips formed from wafers of semiconductor materials. After a wafer is made, the ICs are typically separated from each other by dicing the wafer into small chips. Thereafter, the individual chips are bonded to carriers of various types, interconnected by wires and packaged. Such "two-dimensional" packages of chips fail to optimize the number of circuits that may be fabricated in a given space, and also introduce undesirable signal delays, capacitance, and inductance as signals travel between chips.

Recently, three-dimensional arrays of chips have emerged as an important packaging approach. The typical multi-chip electronic module consists of multiple IC chips adhesively secured together as a monolithic structure (a "plurality of stacked IC chips"). Corresponding edges of the integrated circuit chips, once stacked, form the substantially planar side surface of the electronic module.

Transfer metallurgy from the active area of each integrated circuit chip extends to this side surface facilitating interconnection among the chips and/or external connection to the module. Often, a metallization pattern is provided directly on the side surface, connected to the transfer metallurgy. As used herein and known in the art, the term "transfer metal layer" refers to the metallization layer usually formed above the active surface of each chip subsequent to wafer fabrication.

One significant process step in the formation of an electronic module is the side surface processing necessary to electrically access the transfer metal leads presented to the side surface of the chip stack. When IC chips are defined on a wafer, "kerf" regions (spaces) exist between chips. These kerf regions facilitate separation ("dicing") of the chips without damaging the structures in the "active" region of the chip. After dicing, portions of these kerf regions remain on the chip between the edges of the chip and the active region, adjacent to each. Thus, in order to reach the edge of the chip, the transfer metallurgy must extend from the active region of the chip, and through the kerf region.

Typically, side surface processing entails etching the side surface of the module to expose the transfer metal leads. However, unless preferentially performed, such processing can expose other structures that exist in the kerf regions including chip metallurgy used in forming and testing the active region of the chip when still in wafer form. As used herein and known in the art, the "chip metal layer" is the metal layer(s) used in fabricating and interconnecting the functional active structures of an IC chip (for example, the bit lines, in a dynamic random access memory chip). An etchant is thus chosen which preferentially etches the side surface, including chip metallurgy, but not transfer metallurgy. This "preferential" etch is only possible if the chip metallurgy is different from the transfer metallurgy, enabling an etchant to operate on the chip metal but not the transfer metal. An insulating layer is then applied to the preferentially etched side face and planarized, covering the exposed structures (chip metallurgy), and exposing only the transfer metal leads. Electrical connection to the transfer metal leads may then be performed without danger of shorting to other structures such as a chip metal layer.

In order to completely remove the kerf region structures, several dry and wet etching techniques are often used. By their very nature, these etching processes entail very aggressive environments. Since these etching processes occur after lamination of the stack of IC chips, the transfer metallurgy is exposed to all of the etching environments. This creates the following problems:

1. Transfer metal lead quality damage in the form of degradation, oxidation, and/or corrosion due to etching environment exposure. Damage to the transfer metal lead is particularly harmful, because it is vital to the interchip and external connection of the module (using T-Connects). In addition, the exposed transfer metallurgy presents an excellent opportunity for water and contaminant ingress between the transfer metallurgy and surrounding insulator.

2. Transfer metal material selection is limited to materials that are compatible with (not susceptible to) the etchants used. For example, the transfer metal cannot be aluminum (Al) because there are Al structures (chip metallurgy) in the kerf region that are etched using an Al etch; therefore, etching these structures would result in etching of the transfer metallurgy as well.

3. Each time the side surface is reworked, the etching processes must be repeated. This results in additional fabrication costs, as well as additional exposure to "aggressive" etching environments. This exposure may impact the long term reliability of the module, particularly that of the transfer metal leads and associated T-Connects.

4. The rate and efficiency of side surface etching processes are affected by the rate at which etchants are fed to the etching zone (the side surface) and the rate at which etchant is removed from the etching zone. Thus, geometries which restrict or limit the transport of etchant are inherently more difficult to etch, and usually require longer etching times or more concentrated etchant solutions. The etching of kerf structures during side surface processing presents geometries which are small and limit the etchant transport processes.

5. Current side surface kerf etching processes are optimized for specific combinations of kerf materials (chip metallurgy) and transfer metal materials. Thus, if wafers are provided with alternate kerf materials, the entire side surface process may need to be reoptimized. In fact, the situation may arise where the current side surface etching processes are not workable because of the particular combination of kerf materials (chip metallurgy) and transfer metallurgy.

The present invention is directed towards solving these problems.

DISCLOSURE OF THE INVENTION

Briefly described, the present invention comprises, in a first aspect, a method for forming a plurality of integrated circuit ("IC") chips. The method includes providing a wafer, and forming a plurality of IC chips integral with the wafer such that the wafer has a plurality of kerf regions. Each kerf region is disposed between adjacent IC chips and has a first chip metal layer contained therein. Next, the first "chip metal layer" is removed from the kerf regions. Subsequently, a "transfer metal layer" is formed above the IC chips such that it is mechanically coupled to the IC chips.

As one enhancement, the IC chips may be formed such that the kerf regions include a second "chip metal layer" disposed between and mechanically coupled to the wafer and to the first chip metal layer. Further, the step of removing the first chip metal layer may include removing the second chip metal layer.

In another aspect, the present invention comprises a method for forming a plurality of IC chips. The method includes providing a wafer, and forming a plurality of IC chips integral with the wafer such that the wafer has a plurality of kerf regions. Each kerf region is disposed between adjacent IC chips and has a first chip metal layer and a transfer metal layer contained therein. The chip metal layer is then removed from the kerf regions. As an enhancement, the plurality of IC chips may be formed such that the chip metal layer is coplanar with the transfer metal layer.

A further aspect of the present invention comprises an integrated circuit chip having a support layer, a "chip metal layer" composed of a first type of metal, and a "transfer metal layer" composed of the same type of metal. Both metal layers are mechanically coupled to the support layer. As an enhancement, the chip metal layer is disposed between and mechanically coupled to both the transfer metal layer and to a substrate. Further, the metal that the chip metal layer and transfer metal layer are composed of may be a composite titanium/aluminum-copper metal.

In yet another aspect, the present invention includes a method for forming an electronic module. A plurality of integrated circuit chips are provided, each chip having an edge surface, a first chip metal layer and a transfer metal lead. The chip further includes an active region and a kerf region, with the kerf region being adjacent to an edge surface and the active region adjacent to the kerf region. The chip metal layer is contained only within the active region and the transfer metal lead is contained within the active region and the kerf region. The IC chips are then stacked to form an electronic module.

As an enhancement, the first chip metal layer is disposed between and mechanically coupled to a substrate and to the transfer metal lead. Further, the edge surfaces of the IC chips at least partially define a side surface of the electronic module. A first transfer metal lead of a first IC chip extends towards the side surface. The method includes planarizing the side surface of the module to expose the first transfer metal lead. Further, a patterned insulation layer having an opening therein may be formed on the side surface of the module such that the first transfer metal lead is exposed within the opening.

In another aspect, the present invention includes an electronic module comprising a plurality of stacked IC chips, each chip having a support layer, first chip metal layer composed of a first metal and a transfer metal lead composed of the same metal as the chip metal layer. The transfer metal lead and the first chip metal layer are both mechanically coupled to the support layer. As an enhancement, the chip metal layer is disposed between and mechanically coupled to a substrate and to the transfer metal layer. Moreover, each IC chip may have an edge surface, the edge surfaces at least partially defining a side surface of the electronic module. A first transfer metal lead of a first IC chip extends towards the side surface. Further, the electronic module may have an opening in the side surface. The first transfer metal lead is exposed within the opening and the first chip metal layer of the first IC chip is electrically insulated from the opening.

Advantageously, the present invention provides for the chip metals and transfer metals associated with the stacked IC chips of an electronic module to be formed of the same material. Reliability of the resultant electronic module is thereby improved due to the use of inherently compatible materials. Further, because material within the kerf regions is selectively removed before assembly into an electronic module, less module side surface processing is necessary. Thus, the techniques of the present invention provide for the formation of a better performing, more reliable electronic module, void of the characteristic disadvantages of previous processing techniques.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIGS. 11 and 11A are partial cross-sectional and top schematic views, respectively, of the stack of FIG. 10 after the formation of openings in the insulation layer to expose the transfer metal leads according to the present invention;

FIG. 12 is a partial cross-sectional view of an alternate embodiment of FIG. 11 wherein each IC chip has a completely cleared kerf region;

FIGS. 13 and 13A are partial cross-sectional and top schematic views, respectively, of a stack of IC chips having uncleared kerf regions;

BEST MODE FOR CARRYING OUT THE INVENTION

Figure 1:
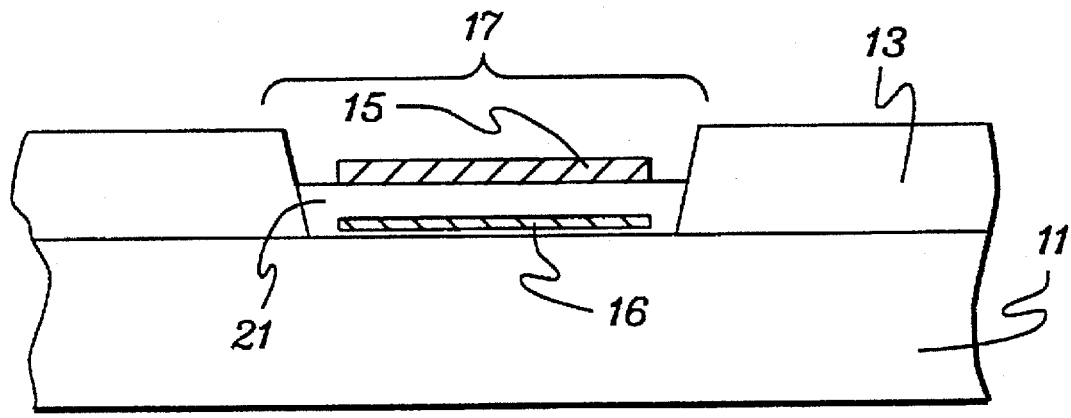
FIG. 1 is a partial cross-sectional view of a wafer having two levels of chip metallization present in a kerf region.

Certain preferred embodiments for clearing the kerf region of IC chips and subsequent assembly of the chips into an electronic module are presented herein. FIG. 1 is a partial cross-sectional view of a wafer comprising a plurality of integrated circuit chips to be used in the formation of an electronic module. Typical functions implemented by the chips may include, for example, memory, interface, processor (for example, a microprocessor) and/or control functions, although each chip may include any function known in the art for implementation on a semiconductor chip.

As shown in FIG. 1, substrate 11 includes a plurality of IC chip active regions (13). Disposed between pairs of active regions are "kerf" regions 17. Within the kerf regions are various chip metal layers as well as insulation. For example, kerf region 17 contains first chip metal layer 15 and second chip metal layer 16 separated by insulator 21. (The insulation mechanically couples each of these layers to the substrate which functions as a support layer.) It should be noted that the term "chip" generally refers to substrate 11 and associated structure such as those contained in active region 13 as well as the kerf region. The collection of "chips" associated with a common substrate (for example, the two "chips" of FIG. 1) comprise a "wafer."

Figure 2:
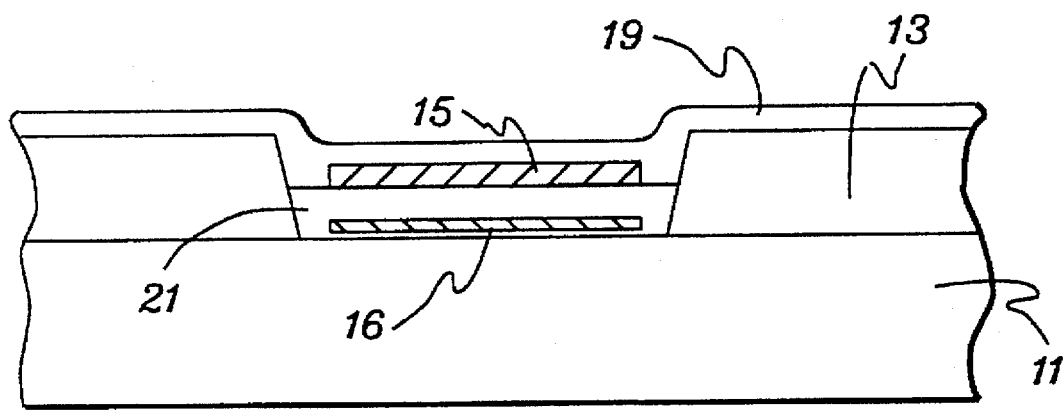
FIG. 2 is a partial cross-sectional view of the wafer of FIG. 1 subsequent to the deposition of a photoresist layer.
Figure 3:
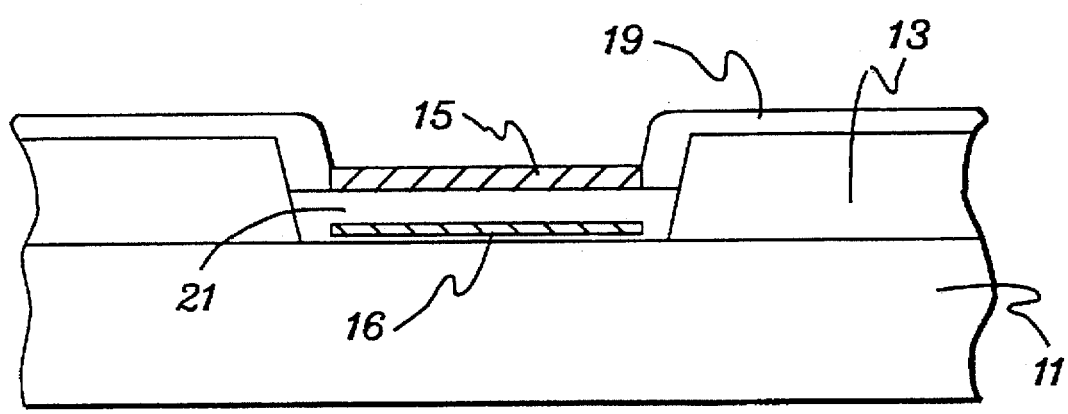
FIG. 3 is a partial cross-sectional view of the wafer of FIG. 2 following the masked exposure and development of the photoresist layer.

The first process step in clearing the kerf region is the deposition of a photoresist layer. As shown in FIG. 2, photoresist layer 19 is deposited on the wafer, covering both the active regions and the kerf region. The photoresist is then exposed using a "kerf clear" mask. The mask is patterned so that once the photoresist is developed, only the kerf regions will be exposed. Active regions 13, and critical structures located in the kerf region, e.g., alignment marks, will remain isolated from subsequent etching by photoresist. FIG. 3 shows the resultant wafer having protected active regions and an exposed kerf region.

Figure 4:
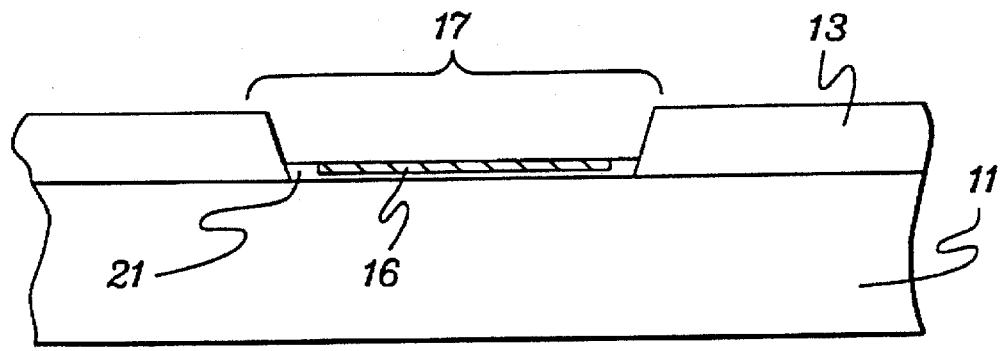
FIG. 4 is a partial cross-sectional view of the wafer of FIG. 3 after partial clearing of the kerf region and removal of all residual photoresist according to the present invention.

The next process step is the etching ("clearing") of the kerf regions on the wafer to remove structures contained therein (FIG. 4). The actual etching process, and etchants used, will vary depending on the structures to be removed within the kerf region. As a typical process example, a $CF_4/O_2$ dry etch is used to eliminate nitride and oxide structures within the kerf region. Metal, such as a composite titanium/aluminum-copper metal (Ti/Al-Cu) may be removed by a chlorine dry etch process.

As shown in FIG. 4, only a partial etch or "kerf clear" is performed. The second chip metal layer (16) is left remaining in the kerf region. This layer is disposed close enough to the wafer such that if left intact, it will not interfere with subsequent electrical connections to the transfer metal after inclusion of the chip within an electronic module comprising a "stack" of chips (discussed in further detail with respect to FIGS. 9–11A below).

As an example, dynamic random access memories (DRAMs) typically contain two metallization layers, a metallization one ("M1") layer and a metallization two ("M2") layer. The M1 layer is usually disposed very close to the wafer, and does not require removal. As shown in FIG. 4, the kerf clear process has been performed removing all but the M1 metallization layer (16) and the insulation disposed below it.

Figure 4A:
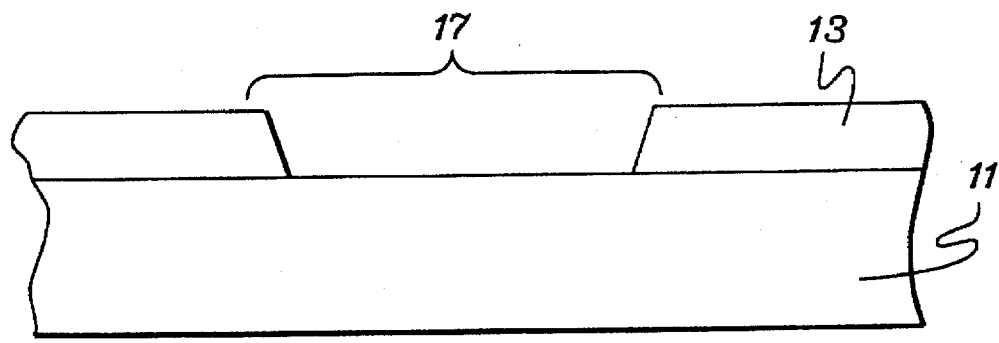
FIG. 4A is a partial cross-sectional view of the wafer of FIG. 3 after complete clearing of the kerf region and removal of all residual photoresist.
Figure 4B:
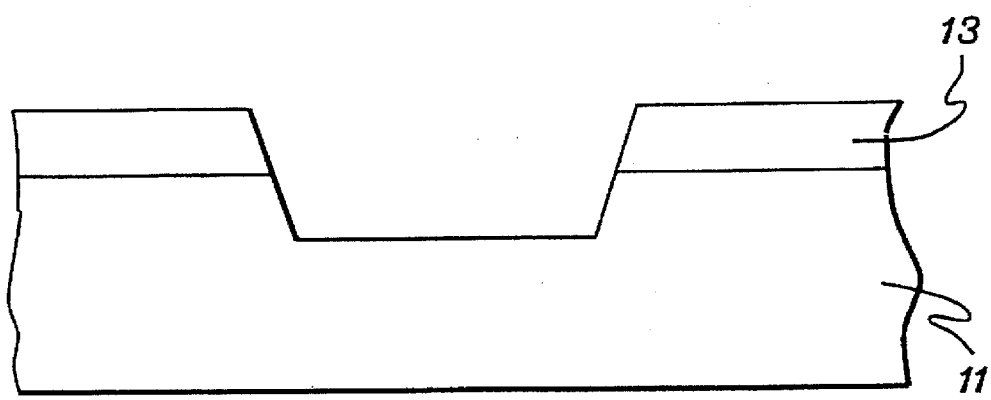
FIG. 4B is a partial cross-sectional view of the wafer of FIG. 3 subsequent to complete clearing of the kerf region including partially etching the wafer within the kerf region, and removal of all residual photoresist.

Alternately, as shown in FIG. 4A, a complete "kerf clear" may be performed removing all material from the kerf region. As shown in FIG. 4B, if further etching is performed, a portion of the wafer substrate may be removed. This facilitates separation ("dicing") of the chips of the wafer. Regardless of the extent to which etching is performed, subsequent to etching the remaining photoresist is stripped off the wafer. For example, excess photoresist may be removed using an oxygen ($O_2$) dry resist strip process.

Figure 5:
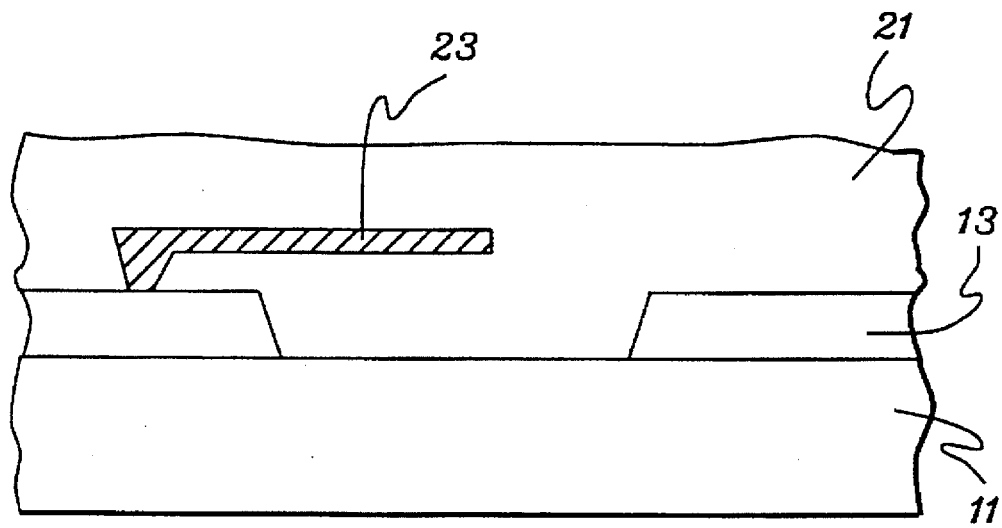
FIG. 5 is a partial cross-sectional view of the wafer of FIG. 4A after completion of the deposition of a planarized lower insulating layer followed by the formation of a transfer metal layer.
Figure 5A:
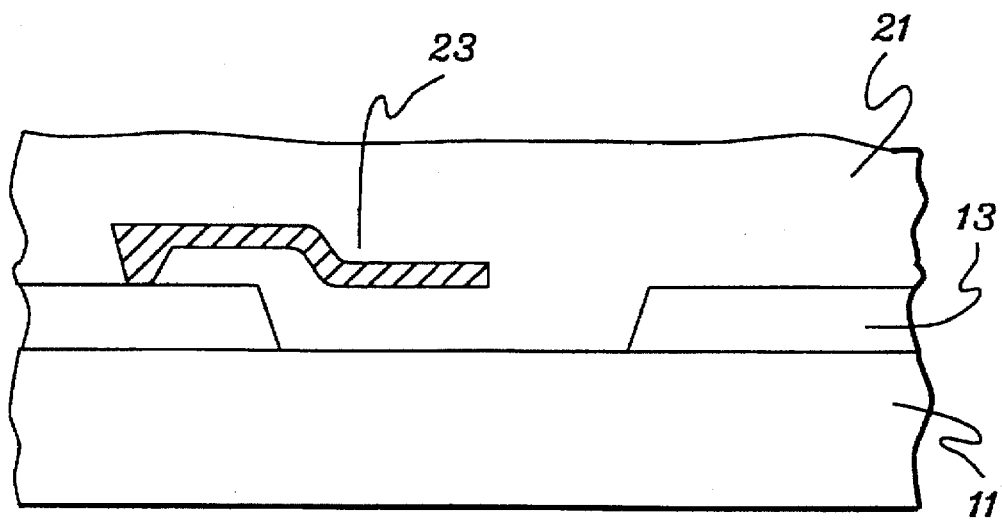
FIG. 5A is a partial cross-sectional view of the wafer of FIG. 4A after the formation of a transfer metal layer without planarizing a deposited lower insulating layer.

Continuing with the preferred embodiment, as shown in FIG. 5, transfer metal 23 has been added to the wafer. The transfer metal may be composed of a variety of materials including the same material as the chip metal layers. As an example, the transfer metal may comprise composite Ti/Al-Cu metal. The insulation 21 above and below the transfer metal layer has been applied such that the transfer metal is disposed substantially horizontally. This is achieved by depositing, and planarizing the insulation layer below the transfer metallurgy before actual formation of the transfer metal layer. As a variation, if this planarization step is omitted, the insulating layer under the transfer metal layer will follow the contour of the active and kerf regions, and the transfer metal layer formed thereon will also follow this contour as shown in FIG. 5A.

Figure 6:
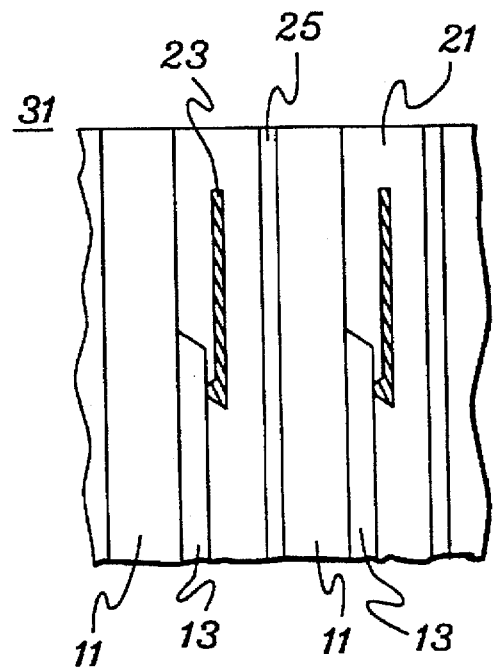
FIG. 6 is a partial cross-sectional view of a stack of multiple IC chips laminated together, each chip having a completely cleared kerf region.

At this point in the process, the kerf regions have been cleared, and the individual IC chips are ready for dicing and stacking into an electronic module. FIG. 6 is a partial cross-sectional view of an incomplete electronic module 31, comprising a plurality of stacked integrated circuit chips (a plurality of chips, "stacked" to form an electronic module) including substrate 11, active circuit region 13 and transfer metallurgy 23. The transfer metal associated with each integrated circuit chip may be used to connect the chip to other chips in the module or to external circuitry. When stacked, transfer metal lead 23 extends towards at least one selected side surface of the unprocessed module. Insulator 21, disposed on the surface of each chip both above and below the transfer metal layer is used for electrical isolation of the transfer metal. Semiconductor chips are laminated together by layers of an adhesive 25. The layers of adhesive may comprise any one of various commercially available high-temperature adhesive materials such as Thermid, manufactured by National Starch and Chemical Co., Bridgewater, N.J.

Figure 7:
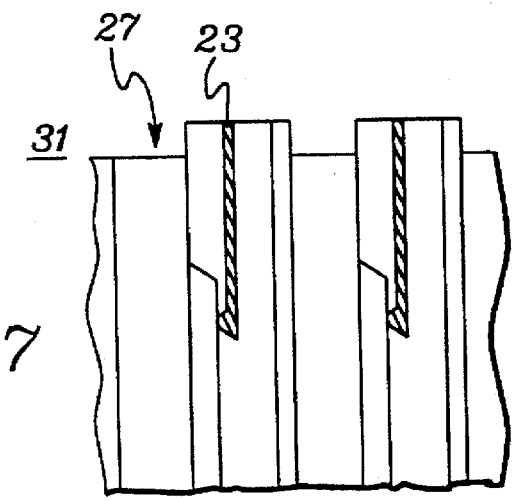
FIG. 7 is a partial cross-sectional view of the stack of FIG. 6 subsequent to planarization and preferential etching of a side surface of the stack.
Figure 8:
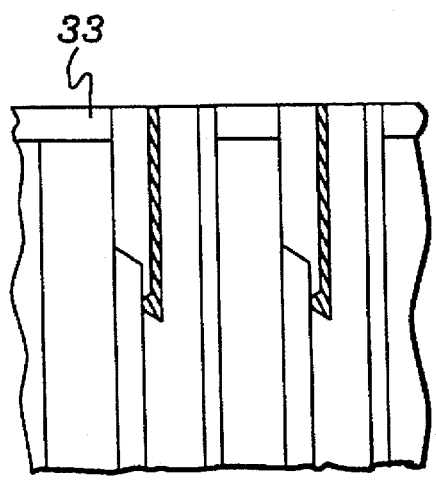
FIG. 8 is a partial cross-sectional view of the stack of FIG. 7 subsequent to the deposition and planarization of an insulating layer on the etched side surface.

As a specific process example, once the semiconductor chips have been laminated into a stack, the selected side surface 27 undergoes a planarization process and a preferential etch process such that only the substrate material is removed to expose the ends of the transfer metal 23, i.e., the transfer metal leads (FIG. 7). It should be noted that since chip metal is absent from the kerf region, etching of the chip metal is not a consideration in selection of the etchant. Thus, the chip metal layer could be composed of the same material as the transfer metal layer. Next, an insulation layer 33 is deposited and planarized so as to expose the transfer metal leads (FIG. 8).

Figure 9:
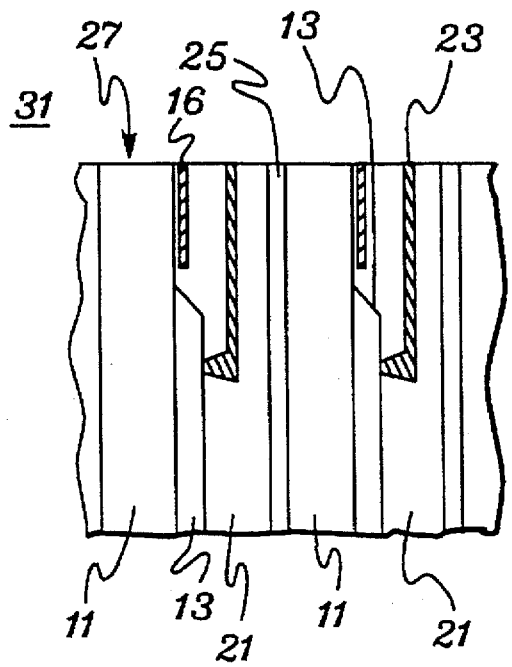
FIG. 9 is a partial cross-sectional view of a stack of multiple IC chips having partially cleared kerf regions and laminated together, the stack having a planarized side surface.
Figure 10:
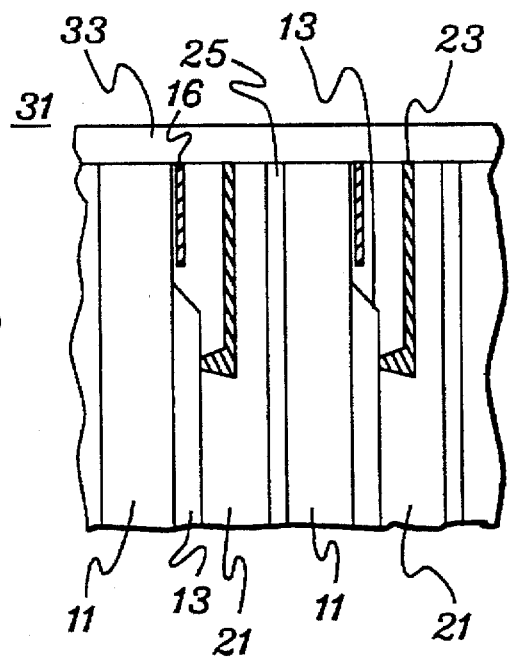
FIG. 10 is a partial cross-sectional view of the stack of FIG. 9 subsequent to the formation of an insulation layer on the side surface.
Figure 11:
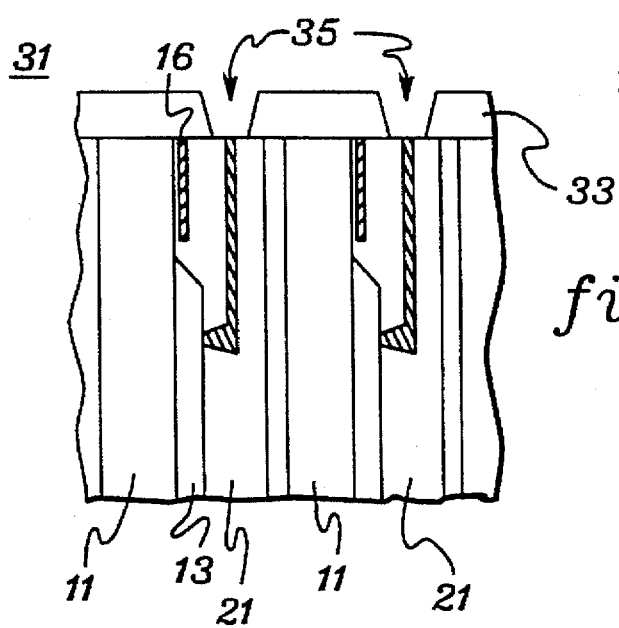

An alternative example of processing the selected side surface of the module to expose the transfer metal leads is depicted in FIGS. 9, 10 and 11. This particular process is useful when a "partial kerf clear" has been performed on the IC chips comprising the module. Once the semiconductor chips have been laminated into a stack, selected side surface 27 undergoes planarizing to expose the transfer metal leads and chip metals (FIG. 9). Thereafter, insulation layer 33 is deposited, covering the chip metal and transfer metal leads (FIG. 10). Vias 35 are then etched according to a particular pattern in the insulating layer exposing the transfer metal leads (FIG. 11).

As shown in FIG. 11, the vias are formed in insulating layer 33 so that second chip metal layer 16 is insulated from the openings (35) exposing the transfer metal leads. This is possible due to the adequate space provided by the insulating layer (21) between the transfer metal layer and the chip metal layer (16). The top schematic view of FIG. 11A further illustrates this structure. As shown, only the transfer metal leads (23) are exposed within the openings (35). Second chip metal layer 16 is fully covered by insulation. Thus, when openings 35 are filled with metal forming T-Connects, there will be no shorts of the transfer metal to the chip metal.

The techniques described herein with respect to FIGS. 9–11A are applicable to modules comprising chips having fully cleared kerf regions. As shown in FIG. 12, chip metal is absent from the kerf region associated with the selected module side surface. Identical techniques may thus be used to form an electronic module with exposed transfer metal leads.

By way of general comparison, FIGS. 13 and 13A show partial cross-sectional and top-schematic views, respectively, of an electronic module comprising chips having uncleared kerf regions. As shown, opening 35 contains the exposed ends of both the transfer metals and first chip metals 15. When the opening 35 is filled with metal to form T-Connects, the transfer metal 23 and first chip metal 15 will short causing malfunctions. In fact, if the first chip metal layer extends across two openings (FIG. 13A), the T-Connects formed within the two openings will short to each other causing additional malfunction. Thus, the kerf clear process is imperative in producing functional electronic modules in accordance with the techniques described herein.

In yet another embodiment, the techniques of the present invention may be used to remove chip metal from the kerf regions of a chip having coplanar chip and transfer metal layers (i.e., a single metallization layer provides the function of the chip and transfer metal layers). As shown in the top schematic view of FIG. 14 and the side cross-sectional views of FIGS. 15 and 16, the chip metallization layer (45 and 45') and the transfer metal 43 are coplanar on the wafer.

Figure 14:
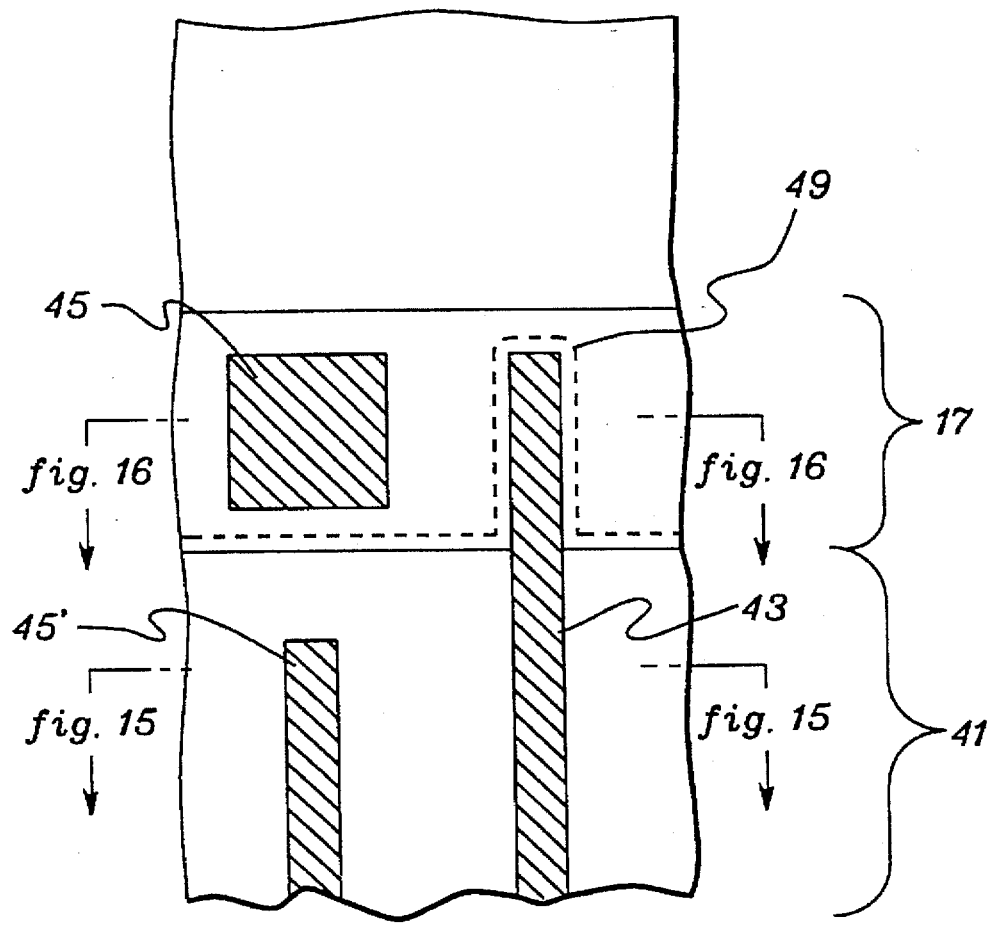
FIG. 14 is a partial top view of a wafer having a coplanar chip metal layer and transfer metal layer according to the present invention.

With respect to FIG. 14, a wafer is shown having both an active region (41) and a kerf region (17). Transfer metal 43 extends from the active region to the kerf region. There are two chip metals shown. The first, chip metal 45 is disposed within the kerf region, and will need to be removed (i.e., "cleared"). Second chip metal 45" is contained within the active region and should remain on the chip once diced. Both the chip metal as well as the transfer metal may comprise the same material, and be formed by a common process (i.e., standard wafer level photolithographic processes).

The process used to remove material from the kerf region (i.e., "clear") is similar to that of the embodiments described hereinabove. A difference exists in the masking of the photoresist layer. As shown in FIG. 14, the photoresist layer has been masked along edge 49, covering transfer metal 43 and chip metal 45', however exposing kerf region chip metal 45 for etching.

Figure 15:
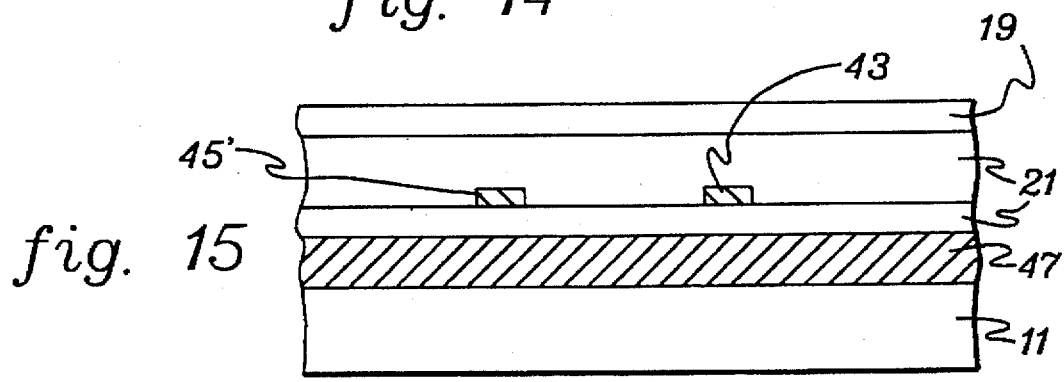
FIGS. 15 and 16 are side cross-sectional views of the wafer of FIG. 14.
Figure 16:
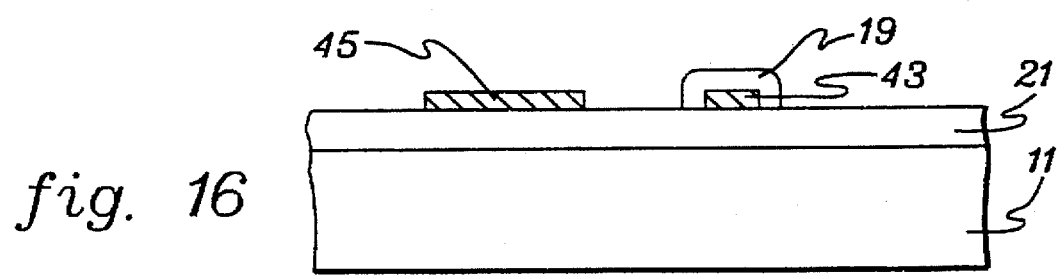

In particular, FIG. 15 shows a cross-sectional view of the wafer within the active region after deposition and development of photoresist 19. As described above, both chip metal 45 and transfer metal 43 are covered by photoresist. Other structures shown include substrate 11, active circuit layer 47 and insulation layers 21. FIG. 16 shows a cross-sectional view of the wafer within the kerf region after exposure and development of the photoresist. Transfer metal 43 is protected by insulating layer 19, while the kerf region chip metal 45 is exposed for etching ("clearing"). It should be generally noted that active circuit layer 47 and upper insulating layers 21 are generally not present within the kerf regions.

After etching is performed, as in previous embodiments described herein, excess photoresist may be removed, leaving chips on a wafer having a "cleared" kerf region. The chips may then be diced from the wafer and ready for assembly into an electronic module.

The techniques of the present invention provide the following advantages:

1. The present invention enables the fabrication of an inherently more reliable electronic module due primarily to: (a) reduced environmental (e.g., etchant and cleaning solutions) exposure of the transfer metallurgy, leading to an inherently more robust T-Connect; and (b) reduced environmental (e.g., etchant and cleaning solutions) exposure of the module.

2. The present invention enables the selection of the transfer metallurgy from a much wider range of candidates. Since the kerf structure etching occurs prior to the deposition of the transfer metallurgy, one no longer needs to restrict the selection to a metallurgy that is compatible with the side surface etching processes. This allows the transfer metallurgy and the chip metallurgy to be identical, thereby improving module reliability through the use of inherently compatible materials.

3. The present invention enables the selection of a much wider range of potential etching processes since one no longer needs to be concerned with interactions with the transfer metallurgy.

4. The present invention makes the electronic module technology inherently less sensitive to the wafer/chip source (e.g., in-house versus outside supplier) in that much wider ranges of etchant and transfer metallurgy are possible.

5. The present invention results in enhanced etching due to the fact that the kerf regions at the wafer level present themselves as wide, shallow channels (compared with narrow, deep channels at the module side surface level); thereby enhancing the etchant solution mass transport processes.

6. This invention reduces the module fabrication costs in that kerf structure etching is done only once, regardless of the number of module side surface reworks. Kerf structure etching is done even if two or more sides of the electronic module require transfer metal connections.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A method for forming a plurality of integrated circuit ("IC") chips comprising the steps of:

(a) providing a wafer;

(b) forming a plurality of IC chips integral with said wafer such that said wafer has a plurality of kerf regions separating active chip regions of said plurality of IC chips, said plurality of kerf regions having a first chip metal layer contained therein;

(c) removing said first chip metal layer from said plurality of kerf regions;

(d) subsequent to step (c), forming a transfer metal layer above said plurality of IC chips such that said transfer metal layer is mechanically coupled to said plurality of IC chips and provides transfer metal leads from said active chip regions into said kerf regions; and (e) dicing said wafer into separated IC chips such that each separated IC chip contains: at least one of said active chip regions, a kerf region of said plurality of kerf regions from which said chip metal layer has been removed, and a transfer metal lead extending from said at least one active chip region into said kerf region, said kerf region being contiguous with a side edge of said separated IC chip; and wherein prior to said step (d) the method further comprises depositing an insulation layer above said plurality of IC chips and planarizing said insulation layer for facilitating substantially planar formation of said transfer metal layer.

2. The method of claim 1, wherein said forming step (b) further comprises forming the plurality of IC chips having a second distinct chip metal layer within said plurality of kerf regions, and wherein said second distinct chip metal layer is disposed between and mechanically coupled to said wafer and to said first chip metal layer.

3. The method of claim 2, wherein said removing step (c) further comprises removing said second distinct chip metal layer from said plurality of kerf regions.

4. The method of claim 1, wherein said removing step (c) further comprises etching a portion of said wafer contained within said plurality of kerf regions to facilitate separation of said plurality of IC chips from said wafer.

5. The method of claim 1, wherein said forming step (b) includes forming the chip metal layer of a first metal, and wherein said forming step (d) comprises forming the transfer metal layer from said first metal.

6. The method of claim 1, wherein said steps (a) and (b) are performed at a different location from steps (c) and (d).

7. A method for forming a plurality of integrated circuit ("IC") chips comprising the steps of:

(a) providing a wafer;

(b) forming a plurality of IC chips integral with said wafer such that said wafer has a plurality of kerf regions separating active chip regions of said plurality of IC chips, said plurality of kerf regions having a chip metal layer and a transfer metal layer contained therein;

(c) removing said chip metal layer from said plurality of kerf regions; and (d) subsequent to step (c), dicing said wafer into separated IC chips such that each separated IC chip contains at least one of said active chip regions and a kerf region of said plurality of kerf regions from which said chip metal layer has been removed, said kerf region being contiguous with a side edge of said separated IC chip; and wherein said forming step (b) includes forming the chip metal layer coplanar with the transfer metal layer.

8. The method of claim 7, wherein said removing step (c) further comprises etching a portion of said wafer contained within said kerf regions to facilitate separation of said plurality of IC chips from said wafer.

9. The method of claim 7, wherein said forming step (b) includes forming the chip metal layer of a first metal and said transfer metal layer also of said first metal.

10. A method for forming an electronic module comprising the steps of:

(a) providing a plurality of integrated circuit ("IC") chips, each IC chip of said plurality of IC chips having an edge surface, a first chip metal layer and a transfer metal lead, said IC chip further including an active region and a kerf region, said kerf region being contiguous with said edge surface, said active region being adjacent to said kerf region, and wherein said first chip metal layer is contained only within said active region and said transfer metal lead is contained within said active region and said kerf region; and, thereafter (b) stacking said plurality of IC chips to form an electronic module;

wherein said providing step (a) comprises providing each IC chip with a substrate, said first chip metal layer being disposed between and mechanically coupled to said substrate and to said transfer metal lead; and wherein said edge surfaces of said plurality of IC chips at least partially define a side surface of the electronic module, said side surface having a first transfer metal lead of a first IC chip of said plurality of IC chips extending theretowards, said method including planarizing said side surface of the module to expose said first transfer metal lead.

11. The method of claim 10, further comprising forming a patterned insulation layer having an opening therein on said side surface of said electronic module such that said first transfer metal lead of said first IC chip of said plurality of IC chips is partially exposed within said opening in said patterned insulation layer.

12. The method of claim 11, wherein said first IC chip includes a second chip metal layer within said kerf region disposed between and mechanically coupled to said first transfer metal lead and to said substrate, said step of forming a patterned insulation layer including insulating said second chip metal layer with said patterned insulation layer.

13. The method of claim 10, wherein said method further comprises selectively etching the side surface of the module to remove a portion of each substrate of said plurality of IC chips.

14. The method of claim 13, wherein said method further comprises depositing an insulating layer on said selectively etched side surface and planarizing said insulating layer to expose each transfer metal lead of said plurality of IC chips.

15. The method of claim 10 further comprising the steps of forming said first chip metal layer of a first metal and also forming said transfer metal lead of said first metal.

* * * * *